United States Patent
Bronn et al.

(10) Patent No.: US 9,438,245 B2
(45) Date of Patent: Sep. 6, 2016

(54) REDUCING SPONTANEOUS EMISSION IN CIRCUIT QUANTUM ELECTRODYNAMICS BY A COMBINED READOUT AND FILTER TECHNIQUE

(71) Applicant: International Business Machines Corporation, Armonk, NY (US)

(72) Inventors: Nicholas T. Bronn, Long Island City, NY (US); Jerry M. Chow, White Plains, NY (US); Jay M. Gambetta, Yorktown Heights, NY (US); Nicholas A. Masluk, Putnam Valley, NY (US); Matthias Steffen, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 129 days.

(21) Appl. No.: 14/512,489

(22) Filed: Oct. 13, 2014

(65) Prior Publication Data

US 2016/0156356 A1 Jun. 2, 2016

(51) Int. Cl.
*H03K 19/195* (2006.01)
*H03K 17/92* (2006.01)
*H03K 19/003* (2006.01)

(52) U.S. Cl.
CPC ...... *H03K 19/195* (2013.01); *H03K 19/00346* (2013.01)

(58) Field of Classification Search
CPC .............. H03K 19/195; H03K 19/00346
USPC .................. 326/1–5; 327/366–369
See application file for complete search history.

(56) References Cited

U.S. PATENT DOCUMENTS

| | | | |
|---|---|---|---|
| 6,347,237 B1 | 2/2002 | Eden et al. | |
| 7,253,654 B2 | 8/2007 | Amin | |
| 7,601,946 B2 | 10/2009 | Powers et al. | |
| 7,932,514 B2 | 4/2011 | Farinelli et al. | |
| 8,159,313 B2 | 4/2012 | Uchaykin | |
| 8,441,329 B2 | 5/2013 | Thom et al. | |
| 8,928,391 B2 * | 1/2015 | Naaman ................. | B82Y 10/00 327/367 |
| 2004/0077503 A1 * | 4/2004 | Blais ..................... | B82Y 10/00 505/190 |

(Continued)

OTHER PUBLICATIONS

J. Majer et al., "Coupling superconducting qubits via a cavity bus," Nature, vol. 449, No. 7161, 2007, pp. 443-447.

(Continued)

*Primary Examiner* — Daniel D Chang
(74) *Attorney, Agent, or Firm* — Cantor Colburn LLP; Vazken Alexanian

(57) ABSTRACT

A mechanism relates a superconductor circuit. A Δ circuit includes a first node connecting a Purcell capacitor to a qubit coupling capacitor, a second node connecting the Purcell capacitor to a readout coupling capacitor, and a third node connecting the qubit coupling capacitor to the readout coupling capacitor. A qubit is connected to the first node and has a qubit frequency. A readout resonator connects to the third node combining with the Purcell capacitor to form a filter. Capacitance of the Purcell capacitor is determined as a factor of the qubit frequency of the qubit and blocks emissions of the qubit at the qubit frequency. Capacitance of the Purcell capacitor causes destructive interference, between a first path containing Purcell capacitor and a second path containing both the qubit coupling capacitor and readout coupling capacitor, in order to block emissions of the qubit at the qubit frequency to the external environment.

25 Claims, 10 Drawing Sheets

(56) References Cited

U.S. PATENT DOCUMENTS

2014/0167811 A1    6/2014   Gambetta et al.
2015/0358022 A1*  12/2015   McDermott, III . H03K 19/1958
                                                        326/5

OTHER PUBLICATIONS

A. Blais et al., Cavity quantum electrodynamics for superconducting electrical circuits: an architecture for quantum computation, Phys. Rev. A, vol. 69, 2004, 062320, 14 pages.

J. Gambetta et al.,"Qubit-photon interactions in a cavity: Measurement-induced dephasing and number splitting," Phys. Rev. A, vol. 74, 2006, 042318, 14 pages.

M. Reed et al., "Fast reset and suppressing spontaneous emission of a superconducting qubit," Appl. Phys. Lett., vol. 96, 2010, 203110, 3 pages.

Y. Yin et al., "Catch and release of microwave photon states," Physical Review Letters, vol. 110, No. 10, 2013, 107001, 5 pages.

* cited by examiner

| QUBIT FREQ (GHz) | C'p (fF) | Cp (fF) |
|---|---|---|
| 4.308 | 865 | 0.15 |
| 4.473 | 766 | 0.17 |
| 4.617 | 688 | 0.19 |
| 4.745 | 625 | 0.21 |
| 4.859 | 572 | 0.23 |
| 4.961 | 529 | 0.25 |

US 9,438,245 B2

REDUCING SPONTANEOUS EMISSION IN CIRCUIT QUANTUM ELECTRODYNAMICS BY A COMBINED READOUT AND FILTER TECHNIQUE

STATEMENT REGARDING FEDERALLY SPONSORED RESEARCH OR DEVELOPMENT

This invention was made with Government support under W911NF-10-1-0324 awarded by Army Research Office (ARO). The Government has certain rights to this invention.

BACKGROUND

The present invention relates to superconducting quantum circuits, and more specifically, to reducing spontaneous emission in circuit quantum electrodynamics by a combined readout and filter technique.

Superconducting quantum computing is a promising implementation of quantum information technology that involves nanofabricated superconducting circuits, using Josephson junctions as non-linear elements.

For an integrated circuit to behave quantum mechanically, the first requirement is the absence (or reduction) of dissipation. More specifically, all metallic parts need to be made out of a material that has minimal loss at the qubit operating temperature and at the qubit transition frequency. This is essential in order for electronic signals to be carried from one part of the chip to another without energy loss, which is a condition for the preservation of quantum coherence. Low temperature superconducting materials are utilized for this task, and accordingly quantum integrated circuit implementations are referred to as superconducting qubit devices.

SUMMARY

According to one embodiment, a superconductor circuit is provided. The superconductor circuit includes a Δ (delta) circuit comprising a first node connecting a Purcell capacitor ($C_P$) to a qubit coupling capacitor ($C_q$), a second node connecting the Purcell capacitor ($C_P$) to a readout coupling capacitor ($C_c$), and a third node connecting the qubit coupling capacitor ($C_q$) to the readout coupling capacitor ($C_c$). A qubit is connected to the first node, and the qubit has a qubit frequency. A readout resonator is connected to the third node, and the readout resonator combines with the Purcell capacitor ($C_P$) to form a filter. The second node is configured for connection to an external environment. Capacitance of the Purcell capacitor ($C_P$) is determined as a factor of the qubit frequency of the qubit, such that the capacitance of the Purcell capacitor ($C_P$) blocks emissions of the qubit at the qubit frequency to the external environment. The capacitance of the Purcell capacitor ($C_P$) is set to cause destructive interference, between a first path containing the Purcell capacitor ($C_P$) and a second path containing both the qubit coupling capacitor ($C_q$) and the readout coupling capacitor ($C_c$), at the qubit frequency in order to block the emissions of the qubit at the qubit frequency to the external environment.

According to one embodiment, a method of providing a superconductor circuit is provided. The method includes providing a Δ circuit comprising a first node connecting a Purcell capacitor ($C_P$) to a qubit coupling capacitor ($C_q$), a second node connecting the Purcell capacitor ($C_P$) to a readout coupling capacitor ($C_c$), and a third node connecting the qubit coupling capacitor ($C_q$) to the readout coupling capacitor ($C_c$). The method includes providing a qubit connected to the first node, wherein the qubit has a qubit frequency, and forming a readout resonator connected to the third node. The readout resonator combines with the Purcell capacitor ($C_P$) to form a filter. The second node is configured for connection to an external environment. Capacitance of the Purcell capacitor ($C_P$) is determined as a factor of the qubit frequency of the qubit, such that the capacitance of the Purcell capacitor ($C_P$) blocks emissions of the qubit at the qubit frequency to the external environment. The capacitance of the Purcell capacitor ($C_P$) is set to cause destructive interference, between a first path containing the Purcell capacitor ($C_P$) and a second path containing both the qubit coupling capacitor ($C_q$) and the readout coupling capacitor ($C_c$), at the qubit frequency in order to block the emissions of the qubit at the qubit frequency to the external environment.

According to one embodiment, a superconductor circuit is provided. The superconductor circuit includes providing a Y circuit comprising a qubit connected to a qubit coupling capacitor ($C'_q$), and the qubit has a qubit frequency. A combination readout resonator and filter includes a Purcell capacitor ($C'_P$), and the Purcell capacitor ($C'_P$) is connected to the qubit coupling capacitor ($C'_q$). A readout coupling capacitor ($C'_c$) is connected to the Purcell capacitor ($C'_P$) and the qubit coupling capacitor ($C'_q$), and the readout coupling capacitor ($C'_c$) is configured for connection to an external environment. Capacitance of the Purcell capacitor ($C'_P$) is determined as a factor of the qubit frequency of the qubit, such that the capacitance of the Purcell capacitor ($C'_P$) blocks emissions of the qubit at the qubit frequency to the external environment. The capacitance of the Purcell capacitor ($C'_P$) is set to short the combination readout resonator and filter including the Purcell capacitor ($C'_P$) to ground at the qubit frequency in order to block the emissions of the qubit at the qubit frequency to the external environment.

According to one embodiment, a method for a superconductor circuit is provided. The method includes providing a Y circuit comprising a qubit connected to a qubit coupling capacitor ($C'_q$), and the qubit has a qubit frequency. The method includes forming a combination readout resonator and filter including a Purcell capacitor ($C'_P$), the Purcell capacitor ($C'_P$) being connected to the qubit coupling capacitor ($C'_q$), and providing a readout coupling capacitor ($C'_c$) connected to the Purcell capacitor ($C'_P$) and the qubit coupling capacitor ($C'_q$). The readout coupling capacitor ($C'_c$) is configured for connection to an external environment. Capacitance of the Purcell capacitor ($C'_P$) is determined as a factor of the qubit frequency of the qubit, such that the capacitance of the Purcell capacitor ($C'_P$) blocks emissions of the qubit at the qubit frequency to the external environment. The capacitance of the Purcell capacitor ($C'_P$) is set to short the combination readout resonator and filter to ground at the qubit frequency in order to block the emissions of the qubit at the qubit frequency to the external environment.

According to one embodiment, a superconductor circuit is provided. The superconducting circuit includes a Δ circuit comprising a first node connecting a Purcell capacitor ($C_P$) to a qubit coupling capacitor ($C_q$), a second node connecting the Purcell capacitor ($C_P$) to a readout coupling capacitor ($C_c$), and a third node connecting the qubit coupling capacitor ($C_q$) to the readout coupling capacitor ($C_c$). A qubit is connected to the first node, and the qubit has a qubit frequency. A readout resonator is connected to the third node, and the readout resonator combines with the Purcell capacitor ($C_P$) to form a filter. The second node is configured for connection to the external environment. An equivalent Y circuit of the Δ circuit includes a qubit coupling capacitor ($C'_q$), a Purcell capacitor ($C'_P$), and a readout coupling capacitor ($C'_c$). Capacitances of the Purcell capacitor ($C_P$), the qubit coupling capacitor ($C_q$), and the readout coupling capacitor ($C_c$) are determined by a Δ-Y transformation as follows $$C_q = \frac{C'_q C'_c + C'_c C'_P + C'_P C'_q}{C'_c}, C_c = \frac{C'_q C'_c + C'_c C'_P + C'_P C'_q}{C'_q},$$

$$\text{and } C_P = \frac{C'_q C'_c + C'_c C'_P + C'_P C'_q}{C'_P}.$$

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
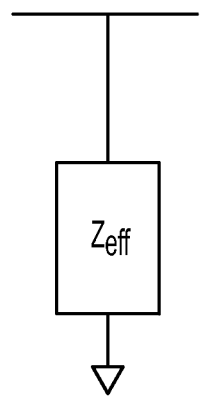
FIG. 1A illustrates a circuit for which effective impedance to ground is calculated according to an embodiment.

The basic building block of quantum information is the quantum bit, or qubit. As unwanted interactions with the environment cause decoherence of the qubit, a delicate balance between isolating the qubit from its environment while still allowing for control and readout to be performed must be achieved. A common approach to mitigating between these competing desires is circuit quantum electrodynamics (cQED), in which a qubit is protected by, and readout is performed through, a resonator possessing a resonant frequency different from that of the qubit. By tuning the cross-talk between the qubit and the external environment in cQED, protection of the qubit can be achieved while still maintaining the ability to perform fast, high-fidelity readout.

Circuit quantum electrodynamics (cQED) is the solid-state analogue of cavity quantum electrodynamics, i.e., the study of the interaction between atoms and photons inside a high-Q cavity resonator. In cQED, atoms are substituted with superconducting qubits, which lie inside a superconducting transmission line resonator, in place of the 3D optical cavity. This architecture is promising to realize a quantum computer, with long coherence times and multi-qubit control. Here, embodiments consider modifications to the transmission line resonator used for readout that can provide qubit lifetime enhancements and increase measurement fidelity, while potentially occupying less space, essential for the scaling of this architecture.

Like atoms in excited states, superconducting qubits such as the transmon qubit spontaneously emit photons, thereby lowering the energy state of the qubit. Since quantum information is stored in the states of the qubits, this spontaneous emission of radiation represents a loss of information and is a major source of error in quantum information processing. The error rate for a quantum operation must be less than $10^{-4}$ for quantum computing to be feasible ($10^{-2}$ for a surface code). However, in a resonant cavity only certain electromagnetic modes can propagate; therefore by placing a qubit in such a cavity, the decay rate can be modified, and this a phenomenon known as the Purcell effect. Dispersive coupling to a readout resonator, in which the state of the qubit can be read out through the cavity resonator's detuned frequency, also helps to suppress the qubit decay rate.

Note that for ease of understanding and not limitation, sub-headings are utilized below.

I. Dispersive Readout

Specifically, in implementing dispersive readout, a qubit with transition frequency ω is coupled to a resonator with resonant frequency $\omega_R$ such that the magnitude of the detuning $\omega - \omega_R$ is much greater than the coupling between the qubit and resonator. Additionally, it is desirable for the circuit to be in the strong coupling regime, where the coupling is greater than both the cavity decay rate κ and decoherence rate γ. (The total decoherence rate γ is related to the excited state relaxation rate $\gamma_1$ and dephasing rate $\gamma_\phi$ by $\gamma = \gamma_1/2 + \gamma_\phi$). The detuning is typically negative to avoid loss though higher-order harmonics of the resonator. The diagonalized effective Hamiltonian for the coupled system is $$H = \hbar(\omega_R + \chi\sigma_z)a^\dagger a + \frac{1}{2}\hbar\omega\sigma_z,$$

where $\sigma_z$ is the Pauli matrix that measured the state of the qubit. Thus, the resonator frequency is 'pulled' by ±χ (known as the dispersive shift) depending on the state of the qubit. In this way, the state of the qubit can be read without destroying its state, known as a quantum non-demolition (QND) measurement. The state can be extracted by the transmitted photon number (if the measurement tone is at $\omega_R \pm \chi$ or phase (if the measurement tone is at $\omega_R$).

The qubit decay rate from the Purcell effect is given by $$\gamma_\kappa = \Re[Y(\Omega)]/C_\Sigma$$

where $C_\Sigma$ includes the Josephson capacitance of the qubit junction and all the shunting capacitances, and $Y(\omega)$ is the total admittance across the qubit junction, and $\omega$ is the transition frequency of the qubit. In the limit where the qubit is capacitively coupled to a single mode resonator the Purcell effect is given by $$T_1 = \frac{(\omega_R^2 - \omega^2)^2}{4\kappa g^2 \omega^2}$$

where $\kappa(\omega) = Z_{env} Z_R C_c^2 \omega^2 \omega_R$ is the loss rate of the resonator with impedance $Z_R$ and $g = \omega_R C_q \sqrt{Z_R \omega / 4 C_\Sigma}$ is coupling between the resonator and qubit through capacitor $C_q$. Clearly, qubit lifetime can be increased by increasing the detuning. However, this comes at a loss of measurement fidelity, which scales inversely with detuning. The qubit-resonator coupling must be strong for dispersive readout, so lifetime cannot be increased by optimizing g. Additionally, for fast readout, $\kappa$ cannot be decreased. Given these tradeoffs, it is beneficial to explore other techniques of implementing dispersive readout while protecting the qubit.

II. Purcell Filter

A microwave element known as a Purcell filter can be introduced between the qubit and the outside world that increases qubit lifetime. Previous realizations of Purcell filters include quarter-wave open transmission line stubs and impedance transformations that mismatch qubit decay channels. By filtering at the qubit frequency $\omega$, but not at the cavity frequency $\omega_R$, the Purcell filter increases qubit lifetime without affecting the readout. Additionally, there is no need to sacrifice qubit-resonator coupling g or photon loss rate $\kappa$, so fast high-fidelity measurements can be performed with enhanced qubit lifetimes. Embodiments present a scheme whereby the Purcell filter is combined with a readout resonator so that measurement and filtering are simultaneously performed.

Embodiments present a circuit that elegantly combines the functions of dispersive readout with that of a Purcell filter. This circuit may be implemented with any planar resonator structure, allowing flexibility in design. In particular, a quasi-lumped element resonator may take the place of the transmission-line resonators, offering considerable savings in substrate area.

III. Resonator Circuits

FIGS. 1A, 1B, 1C, 1D, and 1E illustrate example readout resonator circuits according to an embodiment. The design of the resonator can have a profound impact on readout, both in signal-to-noise and qubit lifetime. By constructing lumped-element circuit models of resonators consisting of explicit circuit elements, as opposed to distributed microwave elements that require the solving of Maxwell's equations to analyze, it is possible for improvements in readout to be approximated. These models may then serve as a starting point for microwave simulation of quasi-lumped or distributed circuit elements before lithographically patterning with the actual qubits for low-temperature experiments.

First, consider the effective impedance to ground, $Z_{eff}$ of the element used for dispersive readout that lies between the qubit and the outside environment, as shown in FIG. 1A. When this impedance is large, there is not much reflection back to the qubit (assuming the environment is impedance-matched to the transmission lines, typically at 50$\Omega$). When this impedance is small, however, more of the signal is reflected back to the qubit. Thus, embodiments can treat this circuit as a filter, with frequencies near the poles passed and rejected if frequencies lie near the zeroes.

Figure 1B:
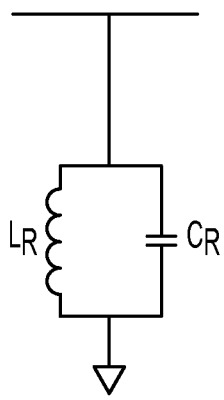
FIG. 1B illustrates a lumped-element resonator circuit.
Figure 1C:
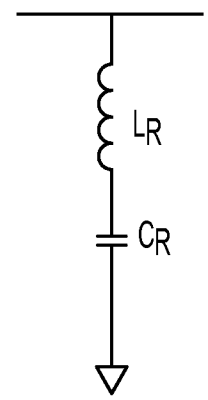
FIG. 1C illustrates an anti-resonator.
Figure 1D:
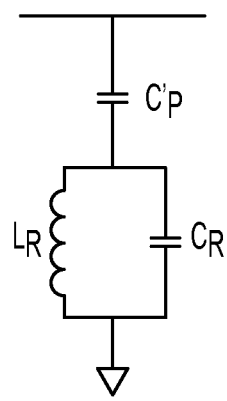
FIG. 1D illustrates the resonator circuit of FIG. 1B with a Purcell capacitor according to an embodiment.

The aforementioned waveguide resonator used for dispersive readout can be modelled as the simple LC lumped-element oscillator of FIG. 1B with resonant frequency $\omega_R = 1/\sqrt{L_R C_R}$. The effective impedance of this circuit as a function of frequency is then $$Z_{resonator, eff}(\omega) = (j\omega L_R) \left\| \left( \frac{1}{j\omega C_R} \right) = \frac{j\omega_R}{1 - \frac{\omega^2}{\omega_R^2}},$$

(where the $\|$ symbol indicates the circuit elements are combined in parallel) which has poles at $\omega = \pm \omega_R$ and a zero at $\omega = 0$. Similarly, the anti-resonator consisting of an inductor and capacitor in series, shown in FIG. 1C, has an effective impedance to ground of $$Z_{anti-resonat, eff}(\omega) = (j\omega L_R) \left\| \left( \frac{1}{j\omega_R} \right) = \frac{1 - \frac{\omega^2}{\omega_R^2}}{j\omega C_R}.$$

Here, the pole is at $\omega = 0$ and the zeroes are at $\omega = \pm \omega_R$, and thus the filter has the exact opposite properties of the resonator, as expected. In particular, the anti-resonator rejects signals at the resonant frequency $\omega_R$, while the resonator passes at that frequency if connected to a matched load.

Figure 1E:
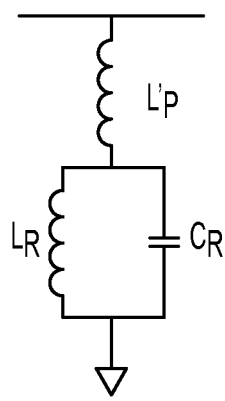
FIG. 1E illustrates the resonator circuit of FIG. 1B with a Purcell inductor according to an embodiment.

Embodiments are designed to combine both kinds of behavior in one circuit, where the readout is performed at the resonant frequency, and the filter is designed to reject the qubit frequency in order to prevent spontaneous emission. Consider the addition of a Purcell capacitor $C_P'$ in series with the resonator, as in FIG. 1D. The Purcell capacitor $C_P'$ in series with the inductor $L_R$ defines an anti-resonator frequency $\omega_{AR} = 1/\sqrt{L_R C_P'}$ as well as the resonator frequency $\omega_R = 1/\sqrt{L_R C_R}$. The impedance to ground of this circuit combination is $$Z_{Purcell\, cap, eff}(\omega) = \frac{1}{j\omega C_p'} + Z_{resonator, eff} = \frac{1 - \frac{\omega^2}{\omega_R^2} - \frac{\omega^2}{\omega_{AR}^2}}{j\omega_p' \left( 1 - \frac{\omega^2}{\omega_R^2} \right)},$$

which is seen to have poles at $\omega = 0$, $\pm \omega_R$ and zeroes when $$\frac{1}{\omega} = \sqrt{\frac{1}{\omega_R^2} + \frac{1}{\omega_{AR}^2}},$$

so that the zero is necessarily less than $\omega_R$. A similar calculation for the circuit with the Purcell inductor $L_P'$ in FIG. 1E gives an impedance to ground of $$Z_{Purcellind,\,eff}(\omega)j\omega L'_P + Z_{resonator,\,eff} = \frac{j\omega(L'_P + L_R)\left(1 - \frac{L'_P}{L'_P + L_R}\frac{\omega^2}{\omega_R^2}\right)}{1 - \frac{\omega^2}{w_R^2}},$$

which has poles at $\pm\omega_R$ and zeroes at $$\omega = 0,\,\pm\omega_R\sqrt{\frac{L'_P + L_R}{L'_P}},$$

and the positive zero is necessarily greater than $\omega_R$. Note that since the impedance of the circuits in FIG. 1 is a function of frequency, the ω above is just the variable frequency, i.e., x-axis of FIG. 2. Later, the qubit frequency is used here since the impedance to ground is used to calculate the filter properties.

FIG. 1A illustrates a circuit for which effective impedance to ground was to be calculated. The LC resonator in FIG. 1B is equivalent to the aforementioned waveguide resonator used to perform dispersive readout, while the anti-resonator in FIG. 1C may protect a qubit from spontaneous emission. By combining the Purcell capacitor $C_P'$ in FIG. 1D or Purcell inductor $L_P'$ in FIG. 1E in series with a resonator, both readout and filtering can be achieved.

Figure 2:
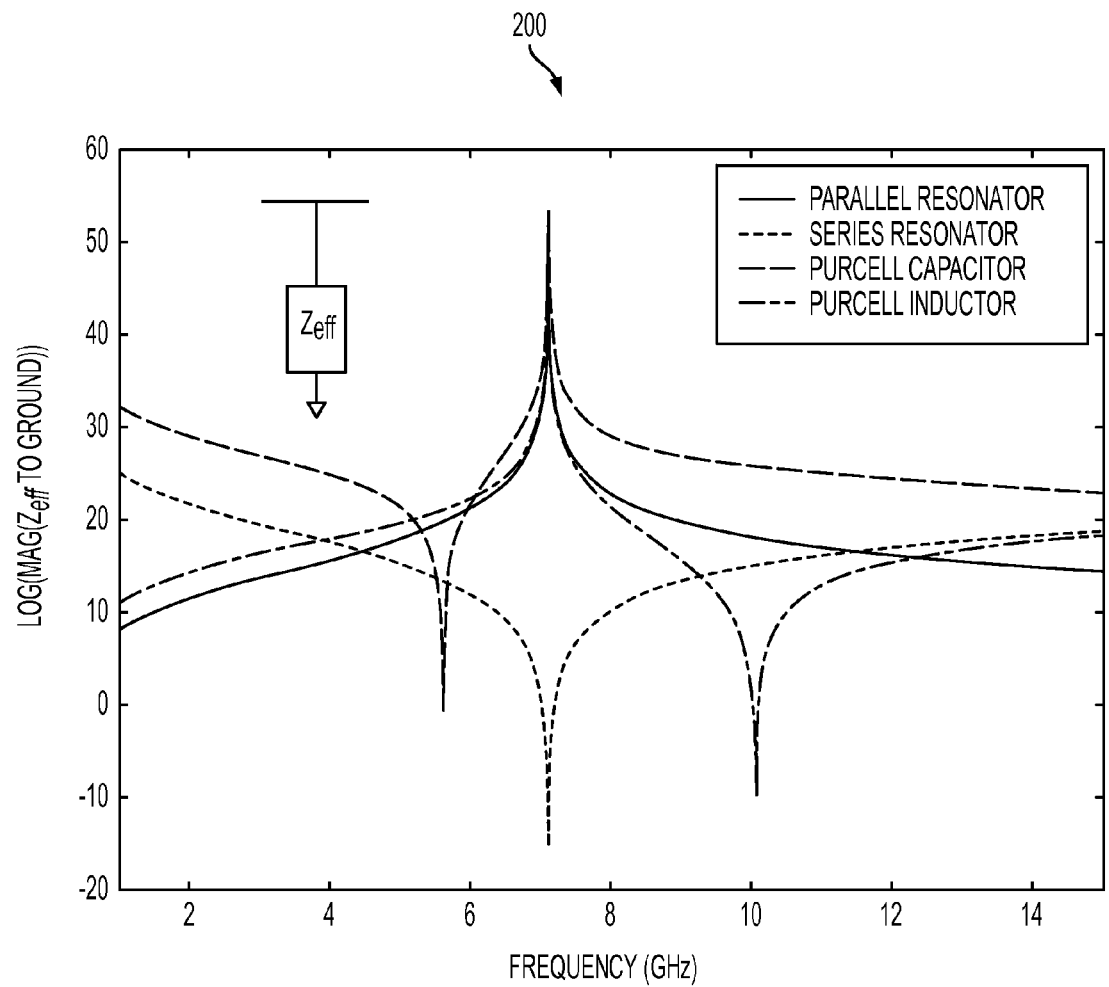
FIG. 2 is a graph illustrating impedance to ground for the circuits according to an embodiment.

The impedance to ground for the circuits discussed in FIG. 1 is depicted in graph 200 of FIG. 2. FIG. 2 shows a logarithm scale of the magnitude of impedance to ground on the y-axis for the circuits in FIG. 1, with $L_R$=1 nH, $C_R$=500 fF, $C_P'$=300 fF, and $L_P'$=1 nH giving a resonator frequency f of $\omega_R/2\pi$=7.12 GHz and anti-resonator frequency of $\omega_{AR}/2\pi$=9.19 GHz. The x-axis shows frequency. As seen in FIG. 2, note that all circuits in FIG. 1 have peaks or dips at the resonator frequency 7.12 GHz. The Purcell circuits feature an additional dip at 5.63 GHz (which can protect a qubit at this frequency) for the capacitor $C_P'$ and 10.07 GHz (which can protect a qubit this frequency) for the inductor $L_P'$, both of which can protect a qubit from decay at their respective frequencies.

As noted above, the circuits (FIGS. 1D and 1E) with the Purcell elements feature dips, in addition to the peaks used for readout, which protect a qubit from spontaneous decay and hence enhance the qubits lifetime. If the qubit frequency is less than the resonator frequency, then a capacitor $C_P'$ can be used. However, if the qubit frequency is higher than that of the resonator frequency, an inductor must be used. In the next section, this filter with Purcell capacitor $C_P'$ is modeled together with the qubit and coupling capacitors.

IV. Interaction of Resonator with Qubit and External World

Figure 3:
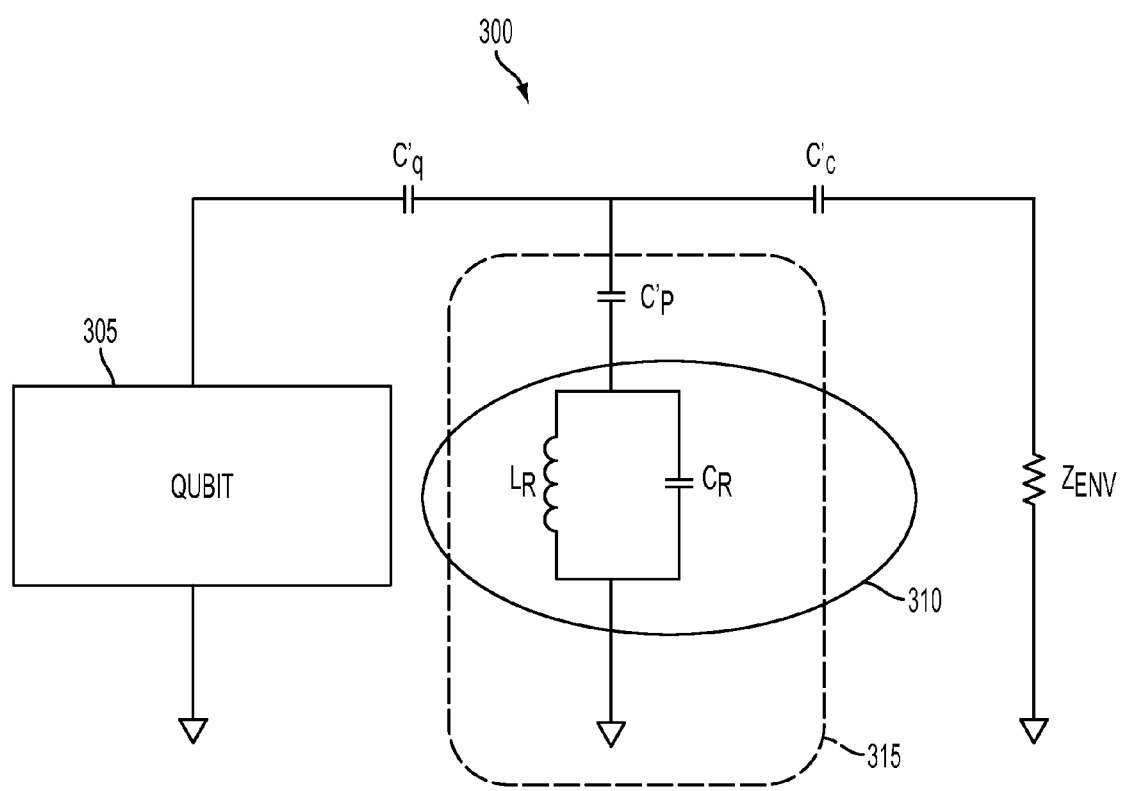
FIG. 3 illustrates a superconducting circuit diagram for implementing a combined resonator and Purcell filter in a Y-configuration according to an embodiment.

Putting the combined resonator and filter from the previous section into a superconducting circuit 300 containing a qubit and taking measurements from the outside world is diagrammed in FIG. 3. FIG. 3 illustrates the superconducting circuit diagram 300 for implementation of a combined readout resonator and Purcell filter in a Y-configuration according to an embodiment. The qubit 305, which includes a superconductor with at least one Josephson junction, is capacitively coupled to a readout resonator 310, which is coupled to the external environment represented by $Z_{env}$=50Ω. The readout resonator 310 is a planar superconducting resonator possessing an inductance $L_R$ and capacitance $C_R$. The Purcell capacitor is $C_P'$. The combination readout resonator and filter 315 is the readout inductor $L_R$ and readout capacitor $C_R$, in series with the Purcell capacitor $C_P'$. The circuit 300 is in the Y-configuration and created from the cQED reflection measurement by adding the Purcell capacitor $C_P'$ in series. The combination readout resonator and filter 315 is a short to ground at the qubit frequency of the qubit 305, thus effectively preventing emissions from the qubit 305 (at the qubit frequency) to $Z_{env}$ and thus increasing the qubit lifetime. When filter 315 is a short to ground, any incident microwave radiation (from qubit 305 at the qubit frequency) is fully reflected and none is transmitted (to the external world represented by $Z_{env}$). Thus, the filter 315 is tuned to be fully reflecting at the qubit 305 frequency. A qubit coupling capacitor $C_q'$ couples the qubit 305 to the combination readout resonator and filter 315 and to the readout resonator capacitor $C_c'$.

Performance parameters of the circuit 300 are calculated in order to model how the combined readout and filter 315 functions when implemented in an actual experiment. Qubit lifetime is calculated to be $$T_1(\omega) = \frac{C_J}{R\left[\frac{1}{Z_{L1}(\omega)}\right]} \text{ where } Z_{L1}(\omega) = (Z_{res} + 1/j\omega C_P') \left\| \left(Z_{env} + \frac{1}{j\omega C_c'}\right) + \frac{1}{j\omega C_q'}\right.$$

and $Z_{res}=(j\omega_R)\|(1/j\omega C_R)$. By analyzing the circuit 300 using network theory, the resonator-qubit coupling g is found to be $$g = \frac{1}{2}\frac{\overline{C_q}}{\Delta\sqrt{Z_1 Z_2}} \text{ with } \frac{1}{C_1} = \frac{\overline{C_R} + \overline{C_q}}{\Delta}\frac{1}{C_2} = \frac{\overline{C_J} + \overline{C_q}}{\Delta} \text{ and } Z_1 = \sqrt{L_J/C_1},$$

$$Z_2 = \sqrt{L_R/C_2}\,\,\Delta = \overline{C_J}\overline{C_R} + \overline{C_J}\overline{C_q} + \overline{C_C}\overline{C_R},\,\, \text{and } \overline{C_J} =$$

$$C_J + \frac{C_c' C_q'}{C_q' + C_c' + C_P'}\overline{C_R} = C_R + \frac{C_c' C_P'}{C_q' + C_c' + C_P'}\overline{C_q} = \frac{C_q' C_P'}{C_q' + C_c' + C_P'}.$$

The readout rate κ is determined by the cavity Q by $\kappa=\omega_R/Q$ and Q is estimated to be $$Q = R_L(\omega_R)\sqrt{\frac{C_R + C_{eff}(\omega_R)}{L_R}}$$

where the effective resistance and capacitance are defined by $$R_L(\omega) = \frac{1}{R\left[\frac{1}{Z_L(\omega)}\right]} \wedge C_{eff}(\omega) = \frac{1}{\omega}I\left[\frac{1}{Z_L(\omega)}\right]$$

from the impedance seen by the resonator $$Z_L(\omega) = \frac{1}{j\omega C_P'} + \left(Z_{env} + \frac{1}{j\omega C_c'}\right)\left\|\left(\frac{1}{j\omega C_J} + \frac{1}{j\omega C_q'}\right)\right..$$

After modeling the necessary capacitances to achieve the desired readout/filter characteristics, experimenters found that the Purcell capacitor $C'_P$ needs to be very large. Such a Purcell capacitor $C'_P$ may have very large stray effects or would need to be patterned using an additional dielectric step in fabrication, thereby risking other sensitive elements of the device. Instead, the Δ-Y transform allows embodiments to pattern the capacitors in the different configuration of FIG. 4, where much smaller values are needed. Performing this transformation gives new capacitances of $$C_q = \frac{C'_q C'_c + C'_c C'_P + C'_P C'_q}{C'_c}$$

$$C_c = \frac{C'_q C'_c + C'_c C'_P + C'_P C'_q}{C'_q}$$

$$C_P = \frac{C'_q C'_c + C'_c C'_P + C'_P C'_q}{C'_P}.$$

Figure 4:
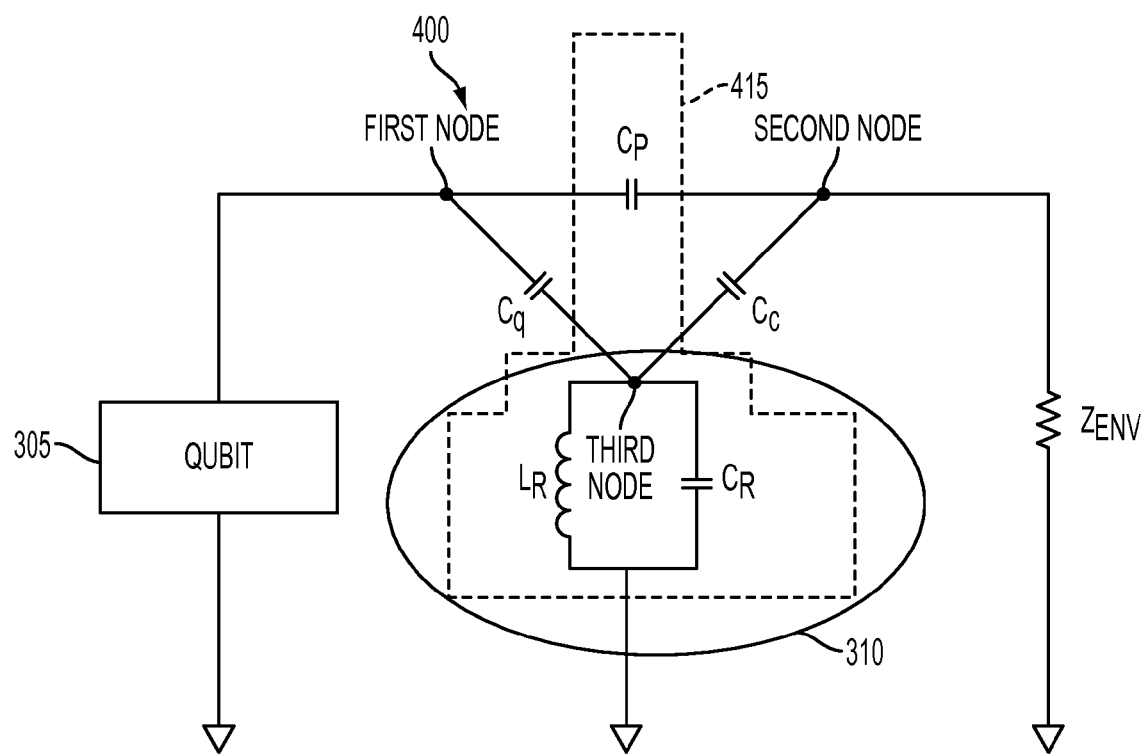
FIG. 4 illustrates a superconducting circuit diagram for implementing a combined resonator and Purcell filter in a Δ-configuration according to an embodiment.

FIG. 4 illustrates a superconducting circuit 400 with a combined readout resonator and Purcell filter 415, and the superconducting circuit 400 is the Δ-configuration equivalent of the circuit 300 according to an embodiment. The capacitance of the Purcell capacitor ($C_P$) is set to cause destructive interference between the paths containing the Purcell capacitor ($C_P$) and the path containing both the qubit coupling capacitor ($C_q$) and the readout coupling capacitor ($C_c$) at the qubit frequency in order to block the emissions of the qubit 305 at the qubit frequency to the external environment $Z_{env}$.

Figure 5:
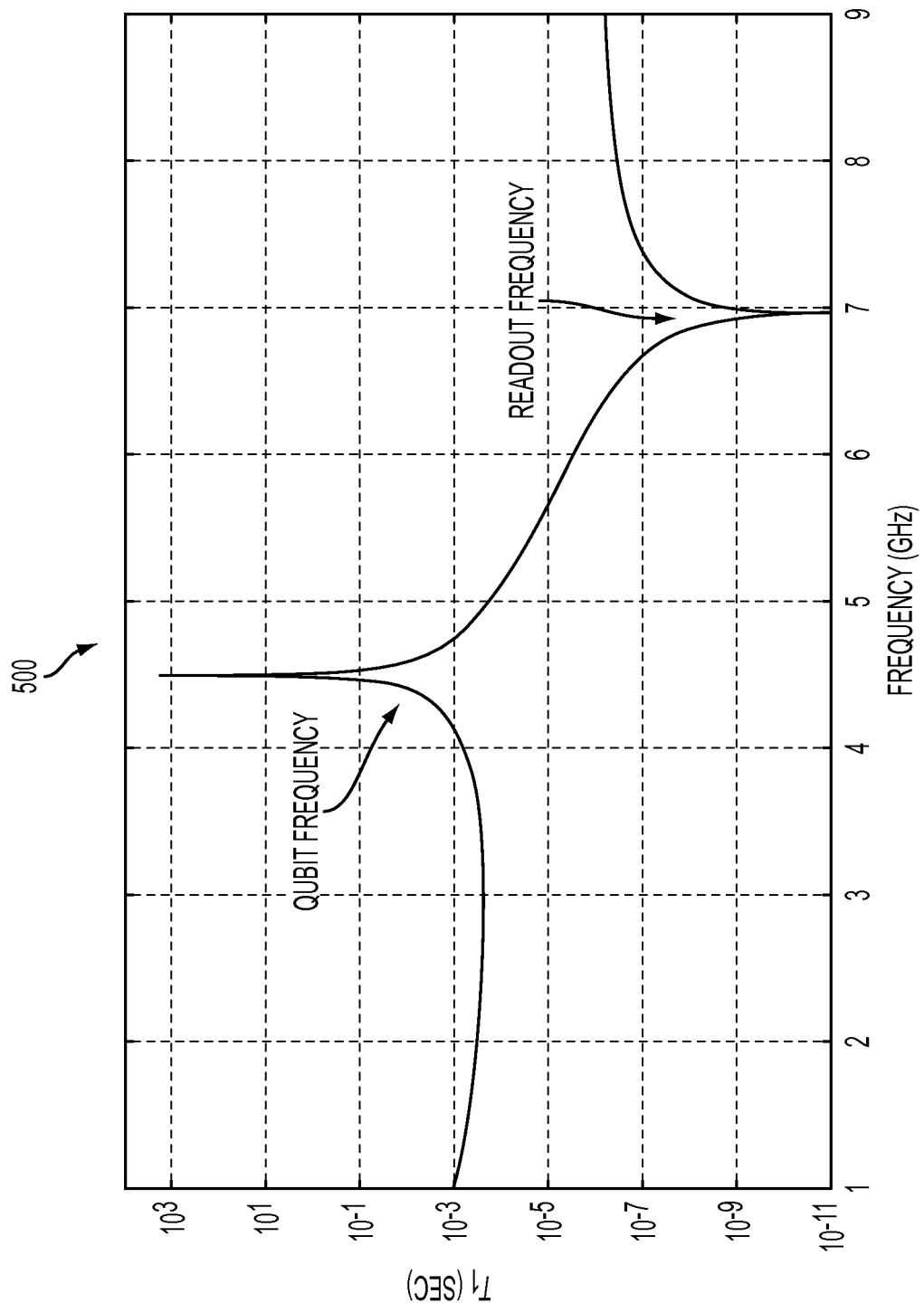
FIG. 5 is a graph of maximum qubit lifetime according to an embodiment.

Once in this d-configuration circuit, maximum qubit lifetime is calculated and shown in FIG. 5. This graph 500 has a dip at the resonator frequency of 7.1 GHz and a peak at 4.5 GHz where suppression of the Purcell effect is offered. This is the qubit frequency at which the qubit's co should be designed to offer lifetime enhancement.

In FIG. 5, the y-axis shows the calculation of the upper bound on energy relaxation times $T_1$ due to the Purcell effect for a qubit with this filter (combination readout resonator and filter 415) with suppression at 4.5 GHz and readout frequency at 7.1 GHz. The parameters for this filter are $C_P$=0.1806 fF, $C_c$=9.690 fF, $C_q$=13.57 fF, $C_R$=500 fF and $L_R$=1 nH.

The measurement scheme can be used in conjunction with any planar readout resonator. For example, in use with a quarter-wavelength Purcell filter similar to that of, this scheme can broaden/enhance the protection at an eighth of the wavelength. Particularly, this scheme works with quasi-lumped resonators, which are much smaller than the transmission line resonators and Purcell filters. This is beneficial for scaling the cQED architecture to allow for multi-qubit coherent operations necessary in the realization of a quantum computer.

Figure 6:
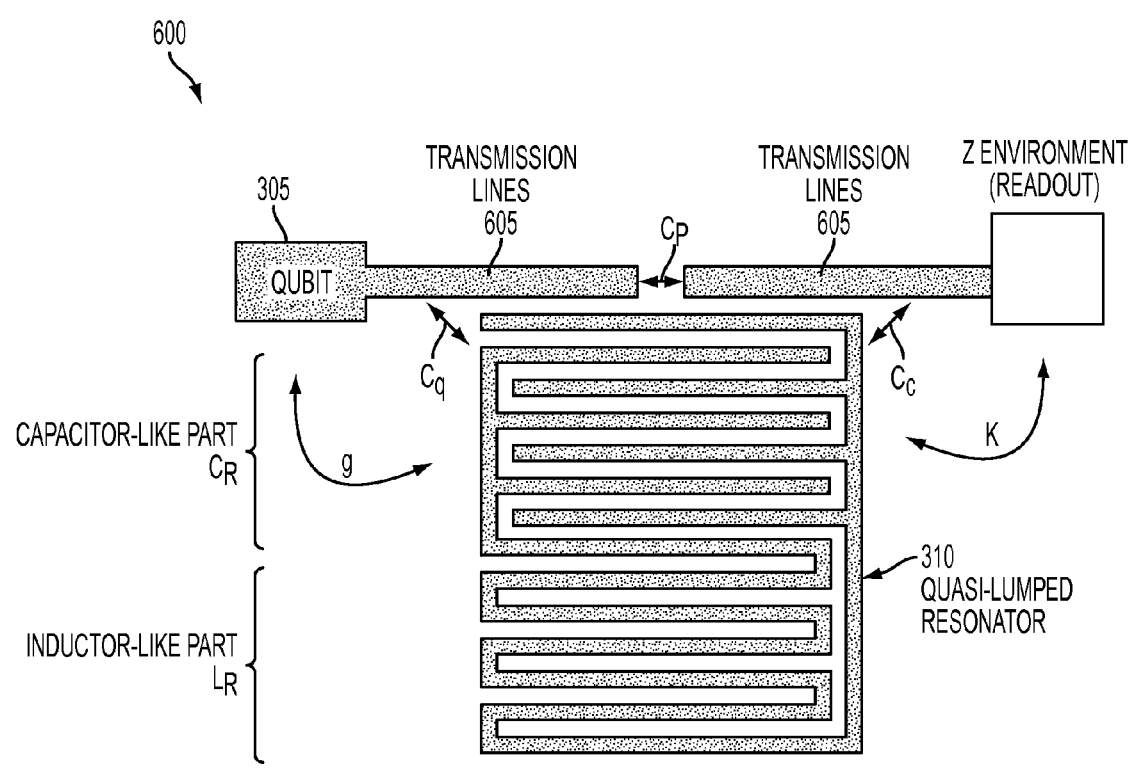
FIG. 6 illustrates a superconducting microwave circuit with a quasi-lumped-element resonator according to an embodiment.

This filter 415 can be implemented easily with standard lithographic procedures for fabricating planar superconducting microwave devices. For example, FIG. 6 shows one such implementation with capacitively-coupled ($C_P$) transmission lines 605 (such as co-planar waveguides, wire, etc.) leading to the qubit 305 and $Z_{env}$ (such as microwave measurement and control electronics). The qubit 305 and $Z_{env}$ are both capacitatively-coupled to the readout resonator 310 (which is shown as a quasi-lumped-element resonator), via $C_q$ and $C_c$, respectively (ground planes not shown). The qubit-resonator coupling g and photon loss rate κ can both be made high, allowing for high fidelity readout, while the detuning of the qubit frequency protects the qubit from decay. FIG. 6 illustrates a quasi-lumped-element superconducting microwave circuit 600 demonstrating how such a combination readout resonator and filter 415 might be implemented. Note that although a quasi-lumped-element resonator is illustrated as the readout resonator 310, other types of readout resonators 310 may be utilized, such as a transmission line resonator.

In FIG. 6, the parameter g describes the coupling between the qubit 305 and resonator 310, and κ describes the coupling between the resonator 310 and the outside world (i.e., $Z_{env}$), where readout occurs. These capacitances ($C_P$, $C_c$, $C_q$) in FIG. 4 can be tuned in the lithographic design of the circuit. If an increase in the Purcell capacitance is desired, e.g., the distance indicated by $C_P$ in FIG. 6 could be decreased. Alternatively, the widths could be increased to increase the amount of surface area each side of the capacitor "sees."

In this implementation, the qubit frequency is below the readout frequency when using $C'_P$. However, when the qubit frequency is higher than the readout frequency, then the Purcell effect could be suppressed by coupling the readout resonator inductively via $L'_P$ as shown in FIG. 1E (in place of the capacitor $C'_P$).

Now moving away from the sub-headings, as discussed herein, the value of the Purcell capacitance ($C'_P$) is well approximated by just considering the zeroes of the impedance of the Purcell capacitor and resonator alone. At this point, the combined filter and resonator 315 is effectively a short to ground from a Y-configuration perspective. The zeroes of the impedance are given in the discussion herein as $$\frac{1}{\omega_q} = \sqrt{\frac{1}{\omega_R^2} + \frac{1}{\omega_{AR}^2}}$$

where $\omega_q$ is the frequency of the qubit 305, $$\omega_R = \frac{1}{\sqrt{L_R C_R}}$$

is the frequency of the resonator 310, and $$\omega_{AR} = \frac{1}{\sqrt{L_R C'_P}}$$

is the frequency of the anti-resonator. Solving this for $C'_P$, the experimenters obtain the Purcell capacitance (in the Y-configuration) necessary to protect the qubit 305 as $$C'_P = \frac{1}{L_R}\left(\frac{1}{\omega_q^2} - L_R C_R\right).$$

Figure 9:
FIG. 9 is a table illustrating Purcell capacitances in the Y-configuration and Δ-configuration according to an embodiment.

This can then be converted to the $C_P$ used in design with the Y-Δ transformation as $$C_P = \frac{C'_q C'_c + C'_c C'_P + C'_P C'_q}{C'_P}$$

and the other capacitors transform according to the equations discussed herein. Table 1 shows representative values of $C'_P$ and $C_P$ given qubit frequency $f=\omega/2\pi$ in FIG. 9. The table 900 illustrates example Purcell capacitances in the Y-configuration ($C'_P$) and Δ-configuration ($C_P$) for the given qubit frequencies according to an embodiment. Note the large difference between these values makes a difference in ease of manufacture. The large values of $C'_P$ may necessitate extra fabrications steps to achieve, while the small values of $C_P$ are easily attainable using our current methods. The values of the other capacitors ($C'_q$ to $C_q$ and $C'_c$ to $C_c$) remain similar (and/or the same) under the Y-Δ transformation.

Figure 7:
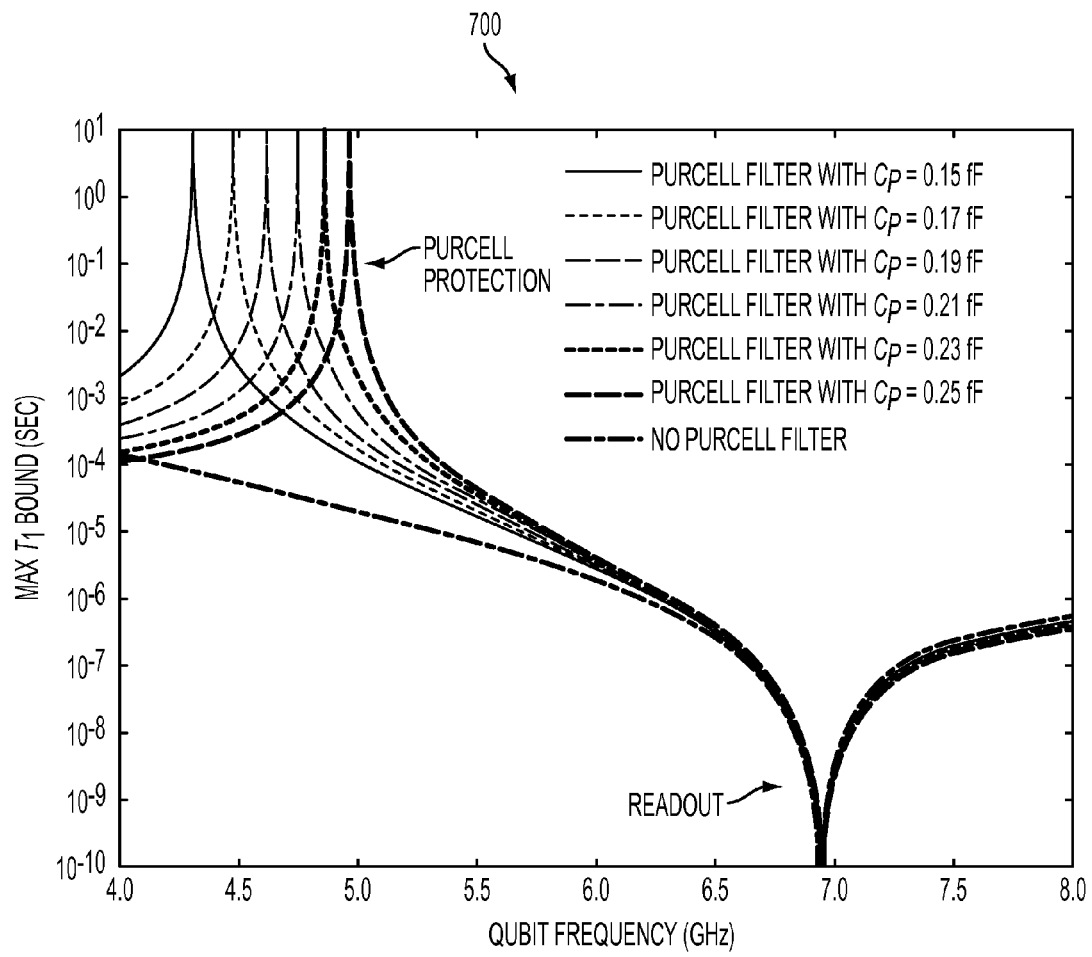
FIG. 7 is a graph illustrating the maximum bounds on qubit lifetime due to the Purcell effect for dispersive readout via the combined resonator and filter according to an embodiment.

For the Δ-configuration, FIG. 7 illustrates a graph 700 with the y-axis showing the maximum bounds on qubit lifetime, $T_1$, due to the Purcell effect for dispersive readout via the combined readout resonator and filter 415 (shown in FIG. 4). The x-axis shows the frequency. The different waveforms show the dispersive readout at each Purcell capacitance $C_P$, and each peak shows the frequency at which the qubit 305 is protected. For FIG. 4, increasing the capacitance of the Purcell capacitor $C_P$ increases the frequency at which the qubit 305 can be protected. In other words, a higher value for the Purcell capacitance $C_P$ is needed to protect a qubit with a higher qubit frequency. As a baseline, the dispersive readout with no peak represents when no Purcell capacitor is used. Purcell protection exhibited for various Purcell capacitances $C_P$ is much larger than that offered by dispersive readout alone. The other circuit parameters corresponding to the circuit in FIG. 4 are $L_R=1$ nH, $C_R=500$ fF, $C_c=18$ fF, $C_q=7$ fF, $C_\Sigma=65$ fF, and $Z_{enc}=50\Omega$.

Figure 8:
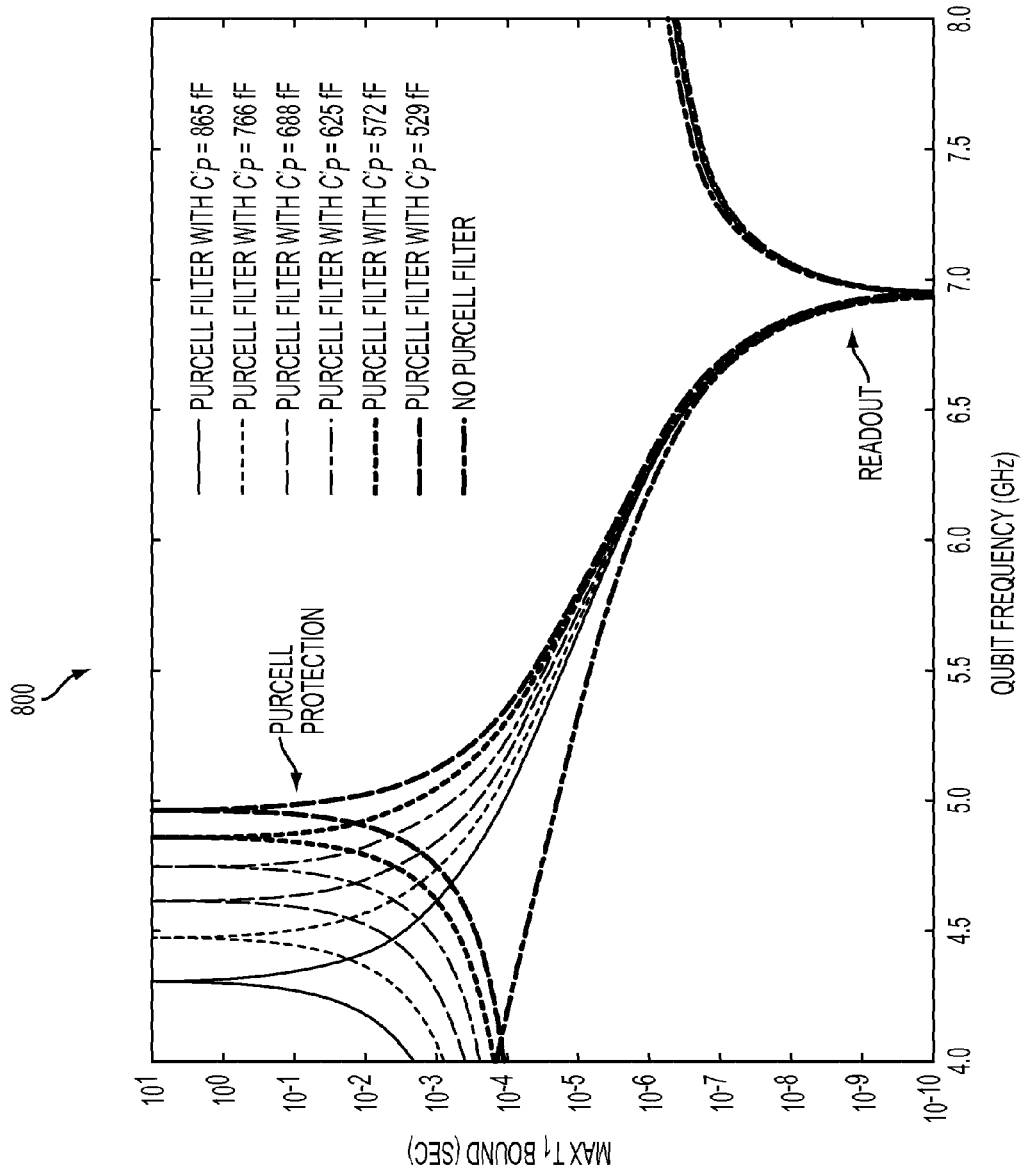
FIG. 8 is a graph illustrating the maximum bounds on qubit lifetime due to the Purcell effect for dispersive readout via the combined resonator and filter according to an embodiment.

For the Y-configuration, FIG. 8 illustrates a graph 800 with the y-axis showing the maximum bounds on qubit lifetime, $T_1$, due to the Purcell effect for dispersive readout via the combined resonator and filter 315 (shown in FIG. 3). The x-axis shows the frequency. The different waveforms show the dispersive readout at each Purcell capacitance $C'_P$, and each peak shows the frequency at which the qubit 305 is protected. For FIG. 3, decreasing the capacitance of the Purcell capacitor $C'_P$ increases the frequency at which the qubit 305 can be protected. In other words, a lower value for the Purcell capacitance $C'_P$ is needed to protect a qubit with a higher qubit frequency, because there is an inverse relationship between the value of the Purcell capacitance $C'_P$ and the qubit frequency of the qubit 305. As a baseline, dispersive readout with no peak represents no Purcell capacitor is used. Purcell protection exhibited for various Purcell capacitances $C'_P$ is much larger than that offered by dispersive readout alone. The other circuit parameters corresponding to the circuit in FIG. 4 are $L_R=1$ nH, $C_R=500$ fF, $C'_c=18$ fF, $C'_q=7$ fF, $C_\Sigma=65$ fF, and $Z_{env}=5012$.

Figure 10:
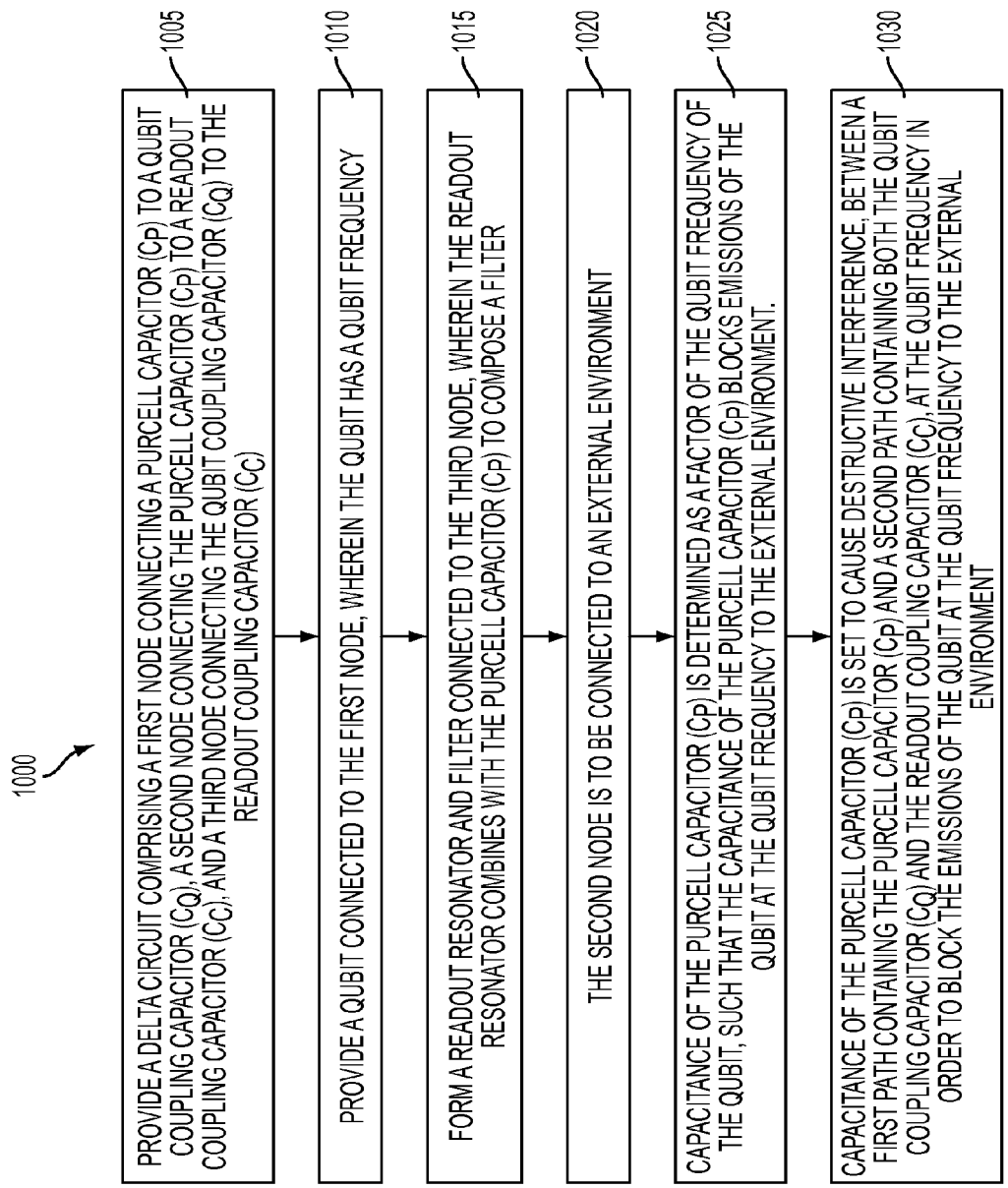
FIG. 10 is a flow chart of a method of providing a superconductor circuit according to an embodiment.

FIG. 10 is a flow chart 1000 for a method of providing a superconductor circuit 400 according to an embodiment. At block 1005, a Δ circuit is provided which comprises a first node connecting a Purcell capacitor ($C_P$) to a qubit coupling capacitor ($C_q$), a second node connecting the Purcell capacitor ($C_P$) to a readout coupling capacitor ($C_c$), and a third node connecting the qubit coupling capacitor ($C_q$) to the readout coupling capacitor ($C_c$).

At block 1010, a qubit 305 connected to the first node is provided, and the qubit 305 has a qubit frequency. At block 1015, the readout resonator 310 is connected to the third node, and the readout resonator 310 and the Purcell capacitor ($C_P$) combine to form the filter 415 (i.e., the combination readout resonator and filter 415). By providing the qubit coupling capacitor ($C_q$) connecting the qubit 305 from the first node to the readout resonator 310 at the third node, the capacitance of the qubit coupling capacitor ($C_q$) determines the strength of the coupling between the qubit 305 and readout resonator 310.

At block 1020, the second node is to be connected to the external environment ($Z_{env}$). By providing the readout coupling capacitor ($C_c$) connecting the readout resonator 310 from the third node to the external environment at the second node, the capacitance of the readout coupling capacitor ($C_c$) determines the rate at which measurements may be made. As understood by one skilled in the art, the external environment ($Z_{env}$) includes measurement and control instruments.

At block 1025, the capacitance of the Purcell capacitor ($C_P$) is determined (designed) as a factor of the qubit frequency of the qubit 305, such that the capacitance of the Purcell capacitor ($C_P$) blocks emissions of the qubit 305 at the qubit frequency to the external environment ($Z_{env}$). At block 1030, the capacitance of the Purcell capacitor ($C_P$) is set to cause destructive interference, between a first path containing the Purcell capacitor ($C_P$) and a second path containing both the qubit coupling capacitor ($C_q$) and the readout coupling capacitor ($C_c$), at the qubit frequency in order to block the emissions of the qubit 305 at the qubit frequency to the external environment ($Z_{env}$). For example, in FIG. 4, there are two paths between qubit 305 and $Z_{env}$, where the first path goes from the qubit 305, through the first node, through the Purcell capacitor ($C_P$), through the second node, and to $Z_{env}$, and where the second path goes from the qubit 305, through the first node, through the qubit coupling capacitor ($C_q$), through the third node, through the readout coupling capacitor ($C_c$), and to $Z_{env}$. The Purcell capacitor ($C_P$) in the first path causes destructive interference on both the qubit coupling capacitor ($C_q$) and the readout coupling capacitor ($C_c$) in the second path, and this destructive interference is at the qubit frequency, thereby blocking (on both paths) the emissions from the qubit 305 (at the qubit frequency) to the external environment ($Z_{env}$). To be more specific, the capacitance of the Purcell capacitor ($C_P$) is set to cause destructive interference of electromagnetic radiation at the qubit frequency between the two paths from the first and second node. Destructive interference takes place from the first to second node via the first path consisting of the Purcell capacitor ($C_P$) and the second path consisting of the qubit coupling capacitor ($C_q$), the third node, and the readout coupling capacitor ($C_c$).

The capacitance of the Purcell capacitor ($C_P$) has a direct relationship to the qubit frequency of the qubit 305 in which the capacitance of the Purcell capacitor ($C_P$) is to be increased when a value of the qubit frequency is increased in order to block the qubit frequency to the external environment.

The combination readout resonator 310 further possesses an inductance $L_R$ (which may represent a readout resonator inductor) and a capacitance $C_R$ (which may represent a readout resonator capacitor) connected in parallel together. The readout resonator 310 (connected to) has a relationship to the Purcell capacitor ($C_P$) based on a Y-configuration (in FIG. 3), thereby forming the combination readout resonator and filter 415 in FIG. 4. In other words, the readout resonator 310 combines with the Purcell capacitor ($C_P$) to have a combined (filter) effect in FIG. 4, which can be traced back to the Y-configuration in FIG. 3.

Upon a Δ-Y transformation to the Y-circuit 300 of FIG. 3, the destructive interference condition is equivalent to choosing the Y-circuit Purcell capacitor ($C'_P$) such that the branch consisting of $C'_P$ and the readout resonator ($L_R$ and $C_R$) (i.e., the circuit in FIG. 1D) is an electrical short at the qubit frequency.

The readout resonator 310 provides dispersive readout of the qubit to the external environment. The combination readout resonator and filter 415 provides filtering at the qubit frequency of the qubit 305 to the external environment.

The capacitance of the Purcell capacitor ($C_P$) is determined from factors that include the qubit frequency of the qubit 305, an inductance of the readout resonator $L_R$, and a capacitance of the readout resonator $C_R$ such that the capacitance of the Purcell capacitor ($C_P$) blocks emissions of the qubit at the qubit frequency to the external environment while allowing dispersive readout of a state of the qubit. Further, the $\Delta$ circuit Purcell capacitor ($C_P$) then in turn also depends on the qubit coupling capacitor ($C_q$) and readout coupling capacitor ($C_c$) after the Y-circuit 300 in FIG. 3 has been transformed into the $\Delta$ circuit 400 in FIG. 4.

The $\Delta$ circuit 400 has a relationship to a Y-configuration in circuit 300. The capacitance of the Purcell capacitors ($C_P$ and $C'_P$) is determined based on the relationship between the $\Delta$ circuit and the Y circuit via the $\Delta$-Y transformation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A superconductor circuit comprising:
   a delta ($\Delta$) circuit comprising a first node connecting a Purcell capacitor ($C_P$) to a qubit coupling capacitor ($C_q$), a second node connecting the Purcell capacitor ($C_P$) to a readout coupling capacitor ($C_c$), and a third node connecting the qubit coupling capacitor ($C_q$) to the readout coupling capacitor ($C_c$);
   a qubit connected to the first node, wherein the qubit has a qubit frequency;
   a readout resonator connected to the third node, wherein the readout resonator combines with the Purcell capacitor ($C_P$) to form a filter; and
   the second node configured for connection to an external environment;
   wherein capacitance of the Purcell capacitor ($C_P$) is determined as a factor of the qubit frequency of the qubit, such that the capacitance of the Purcell capacitor ($C_P$) blocks emissions of the qubit at the qubit frequency to the external environment; and
   wherein the capacitance of the Purcell capacitor ($C_P$) is set to cause destructive interference, between a first path containing the Purcell capacitor ($C_P$) and a second path containing both the qubit coupling capacitor ($C_q$) and the readout coupling capacitor ($C_c$), at the qubit frequency in order to block the emissions of the qubit at the qubit frequency to the external environment.

2. The superconductor circuit of claim 1, wherein the capacitance of the Purcell capacitor ($C_P$) has a direct relationship to the qubit frequency of the qubit in which the capacitance of the Purcell capacitor ($C_P$) is to be increased when a value of the qubit frequency is increased in order to block the qubit frequency to the external environment.

3. The superconductor circuit of claim 1, wherein the readout resonator further possesses an inductance and a capacitance connected in parallel together.

4. The superconductor circuit of claim 1, wherein the readout resonator provides dispersive readout of the qubit to the external environment.

5. The superconductor circuit of claim 4, wherein the readout resonator combined with the Purcell capacitor ($C_P$) provides filtering at the qubit frequency of radiation from the qubit to the external environment.

6. The superconductor circuit of claim 3, wherein the capacitance of the Purcell capacitor ($C_P$) is determined based on factors which include the qubit frequency of the qubit, the inductance of the readout resonator, and the capacitance of the readout resonator such that the capacitance of the Purcell capacitor ($C_P$) blocks emissions of the qubit at the qubit frequency to the external environment while allowing dispersive readout of a state of the qubit.

7. The superconductor circuit of claim 1, wherein the qubit includes a Josephson junction.

8. The superconductor circuit of claim 1, wherein the $\Delta$ circuit has a relationship to a Y circuit;
   wherein the capacitance of the Purcell capacitor ($C_P$) is determined based on the relationship between the $\Delta$ circuit and the Y circuit.

9. A method of providing a superconductor circuit, the method comprising:
   providing a delta ($\Delta$) circuit comprising a first node connecting a Purcell capacitor ($C_P$) to a qubit coupling capacitor ($C_q$), a second node connecting the Purcell capacitor ($C_P$) to a readout coupling capacitor ($C_c$), and a third node connecting the qubit coupling capacitor ($C_q$) to the readout coupling capacitor ($C_c$);
   providing a qubit connected to the first node, wherein the qubit has a qubit frequency; and
   forming a readout resonator connected to the third node, wherein the readout resonator combines with the Purcell capacitor ($C_P$) to form a filter;
   wherein the second node is configured for connection to an external environment;
   wherein capacitance of the Purcell capacitor ($C_P$) is determined as a factor of the qubit frequency of the qubit, such that the capacitance of the Purcell capacitor ($C_P$) blocks emissions of the qubit at the qubit frequency to the external environment; and
   wherein the capacitance of the Purcell capacitor ($C_P$) is set to cause destructive interference, between a first path containing the Purcell capacitor ($C_P$) and a second path containing both the qubit coupling capacitor ($C_q$) and the readout coupling capacitor ($C_c$), at the qubit frequency in order to block the emissions of the qubit at the qubit frequency to the external environment.

10. The method of claim 9, wherein the capacitance of the Purcell capacitor ($C_P$) has a direct relationship to the qubit frequency of the qubit in which the capacitance of the Purcell capacitor ($C_P$) is to be increased when a value of the qubit frequency is increased in order to block the qubit frequency to the external environment.

11. The method of claim 9, wherein the readout resonator further possesses an inductance and a capacitance connected in parallel together.

12. The method of claim 9, wherein the readout resonator provides dispersive readout of the qubit to the external environment.

13. The method of claim 12, wherein the readout resonator combined with the Purcell capacitor ($C_P$) provides filtering at the qubit frequency of radiation from the qubit to the external environment.

14. The method of claim 12, wherein the capacitance of the Purcell capacitor ($C_P$) is determined based on factors which include the qubit frequency of the qubit, an inductance of the readout resonator, and a capacitance of the readout resonator such that the capacitance of the Purcell capacitor ($C_P$) blocks emissions of the qubit at the qubit frequency to the external environment while allowing dispersive readout of a state of the qubit.

15. The method of claim 9, wherein the qubit includes a Josephson junction.

16. The method of claim 9, wherein the Δ circuit has a relationship to a Y circuit;
wherein the capacitance of the Purcell capacitor ($C_P$) is determined based on the relationship between the Δ circuit and the Y circuit.

17. A superconductor circuit comprising:
a qubit connected to a qubit coupling capacitor ($C'_q$), wherein the qubit has a qubit frequency;
a combination readout resonator and filter including a Purcell capacitor ($C'_P$), the Purcell capacitor ($C'_P$) being connected to the qubit coupling capacitor ($C'_q$);
a readout coupling capacitor ($C'_c$) connected to the Purcell capacitor ($C'_P$) and the qubit coupling capacitor ($C'_q$), the readout coupling capacitor ($C'_c$) configured for connection to an external environment;
wherein capacitance of the Purcell capacitor ($C'_P$) is determined as a factor of the qubit frequency of the qubit, such that the capacitance of the Purcell capacitor ($C'_P$) blocks emissions of the qubit at the qubit frequency to the external environment; and
wherein the capacitance of the Purcell capacitor ($C'_P$) is set to short the combination readout resonator and filter including the Purcell capacitor ($C'_P$) to ground at the qubit frequency in order to block the emissions of the qubit at the qubit frequency to the external environment.

18. The superconductor circuit of claim 17, wherein the capacitance of the Purcell capacitor ($C'_P$) has an inverse relationship to the qubit frequency of the qubit in which the capacitance of the Purcell capacitor ($C'_P$) is to be decreased when a value of the qubit frequency is increased in order to block the qubit frequency to the external environment.

19. The superconductor circuit of claim 17, wherein the combination readout resonator and filter further includes a readout resonator inductance and a readout resonator capacitance connected in parallel together;
wherein the readout resonator is connected in series to the Purcell capacitor ($C'_P$), thereby forming the combination readout resonator and filter.

20. The superconductor circuit of claim 17, wherein the combination readout resonator and filter provides dispersive readout of the qubit to the external environment.

21. A method for a superconductor circuit, the method comprising:
providing a qubit connected to a qubit coupling capacitor ($C'_q$), wherein the qubit has a qubit frequency;
forming a combination readout resonator and filter including a Purcell capacitor ($C'_P$), the Purcell capacitor ($C'_P$) being connected to the qubit coupling capacitor ($C'_q$); and
providing a readout coupling capacitor ($C'_c$) connected to the Purcell capacitor ($C'_P$) and the qubit coupling capacitor ($C'_q$), the readout coupling capacitor ($C'_c$) configured for connection to an external environment;
wherein capacitance of the Purcell capacitor ($C'_P$) is determined as a factor of the qubit frequency of the qubit, such that the capacitance of the Purcell capacitor ($C'_P$) blocks emissions of the qubit at the qubit frequency to the external environment; and
wherein the capacitance of the Purcell capacitor ($C'_P$) is set to short the combination readout resonator and filter to ground at the qubit frequency in order to block the emissions of the qubit at the qubit frequency to the external environment.

22. The method of claim 21, wherein the capacitance of the Purcell capacitor ($C'_P$) has an inverse relationship to the qubit frequency of the qubit in which the capacitance of the Purcell capacitor ($C'_P$) is to be decreased when a value of the qubit frequency is increased in order to block the qubit frequency to the external environment.

23. The method of claim 21, wherein the combination readout resonator and filter further includes a readout resonator inductance and a readout resonator capacitance connected in parallel together;
wherein the readout resonator is connected in series to the Purcell capacitor ($C'_P$), thereby forming the combination readout resonator and filter.

24. The method of claim 21, wherein the combination readout resonator and filter provides dispersive readout of the qubit to the external environment.

25. A superconductor circuit comprising:
a delta (Δ) circuit comprising a first node connecting a Purcell capacitor ($C_P$) to a qubit coupling capacitor ($C_q$), a second node connecting the Purcell capacitor ($C_P$) to a readout coupling capacitor ($C_c$), and a third node connecting the qubit coupling capacitor ($C_q$) to the readout coupling capacitor ($C_c$);
a qubit connected to the first node, wherein the qubit has a qubit frequency;
a readout resonator connected to the third node, wherein the readout resonator combines with the Purcell capacitor ($C_P$) to form a filter; and
the second node configured for connection to the external environment;
wherein the delta circuit is equivalent to a Y circuit;
wherein the Y circuit includes a qubit coupling capacitor ($C'_q$), a Purcell capacitor ($C'_P$), and a readout coupling capacitor ($C'_c$);
wherein capacitances of the Purcell capacitor ($C_P$), the qubit coupling capacitor ($C_q$), and the readout coupling capacitor ($C_c$) are determined by a Δ-Y transformation as follows:

$$C_q = \frac{C'_q C'_c + C'_c C'_P + C'_P C'_q}{C'_c};$$

$$C_c = \frac{C'_q C'_c + C'_c C'_P + C'_P C'_q}{C'_q}; \text{ and}$$

$$C_P = \frac{C'_q C'_c + C'_c C'_P + C'_P C'_q}{C'_P}.$$

* * * * *